United States Patent
Okamoto

(10) Patent No.: US 11,556,303 B2
(45) Date of Patent: Jan. 17, 2023

(54) DIGITAL SIGNAL PROCESSING DEVICE AND CONTROL METHOD OF DIGITAL SIGNAL PROCESSING DEVICE

(71) Applicant: KABUSHIKI KAISHA KAWAI GAKKI SEISAKUSHO, Hamamatsu (JP)

(72) Inventor: Seiji Okamoto, Hamamatsu (JP)

(73) Assignee: KABUSHIKI KAISHA KAWAI GAKKI SEISAKUSHO, Hamamatsu (JP)

(*) Notice: Subject to any disclaimer, the term of this patent is extended or adjusted under 35 U.S.C. 154(b) by 12 days.

(21) Appl. No.: 17/375,526

(22) Filed: Jul. 14, 2021

(65) Prior Publication Data
US 2022/0100458 A1    Mar. 31, 2022

(30) Foreign Application Priority Data
Sep. 25, 2020    (JP) .............................. JP2020-160987

(51) Int. Cl.
| | |
|---|---|
| *G06F 12/02* | (2006.01) |
| *G06F 3/16* | (2006.01) |
| *G11C 11/4096* | (2006.01) |
| *G11C 11/4076* | (2006.01) |
| *G11C 11/4093* | (2006.01) |

(52) U.S. Cl.
CPC ............ *G06F 3/16* (2013.01); *G11C 11/4076* (2013.01); *G11C 11/4093* (2013.01); *G11C 11/4096* (2013.01)

(58) Field of Classification Search
CPC ........................................................ G06F 3/16
See application file for complete search history.

(56) References Cited

U.S. PATENT DOCUMENTS

| | | | |
|---|---|---|---|
| 6,366,971 B1* | 4/2002 | Ando ................... | G10H 1/0058 710/52 |
| 2010/0088466 A1* | 4/2010 | Nakanishi ............. | G06F 3/0613 711/E12.008 |
| 2022/0114085 A1* | 4/2022 | Okamoto ............ | G06F 13/1668 |

FOREIGN PATENT DOCUMENTS

| | | |
|---|---|---|
| JP | 58-2935 A | 1/1983 |
| JP | 62-57067 A | 3/1987 |
| JP | 2003-108122 A | 4/2003 |

\* cited by examiner

*Primary Examiner* — Min Huang
(74) *Attorney, Agent, or Firm* — Birch, Stewart, Kolasch & Birch, LLP

(57) ABSTRACT

A digital signal processing device includes a control unit that performs control to alternately burst transfer burst length audio data in a first half area of a first buffer memory and burst length audio data in a second half area of the first buffer memory to a DRAM, in which the control unit performs control to burst transfer the burst length audio data in the first half area of the first buffer memory to the DRAM while writing audio data one word at a time to the second half area of the first buffer memory in sequence and performs control to burst transfer the burst length audio data in the second half area of the first buffer memory to the DRAM while writing audio data one word at a time to the first half area of the first buffer memory in sequence.

5 Claims, 4 Drawing Sheets

FIG. 2

|     | A0 | A1 | A2 | A3 | A4 | A5 | A6 | A7 | A8 | A9 | A10 | A11 | A12 | A13 | A14 | A15 |
|-----|----|----|----|----|----|----|----|----|----|----|-----|-----|-----|-----|-----|-----|
| T0  | –  | –  | a  | –  | –  | –  | –  | –  | –  | –  | –   | –   | –   | –   | –   | –   |
| T1  | –  | –  | a  | b  | –  | –  | –  | –  | –  | –  | –   | –   | –   | –   | –   | –   |
| T2  | –  | –  | a  | b  | c  | –  | –  | –  | –  | –  | –   | –   | –   | –   | –   | –   |
| T3  | –  | –  | a  | b  | c  | d  | –  | –  | –  | –  | –   | –   | –   | –   | –   | –   |
| T4  | –  | –  | a  | b  | c  | d  | e  | –  | –  | –  | –   | –   | –   | –   | –   | –   |
| T5  | –  | –  | a  | b  | c  | d  | e  | f  | –  | –  | –   | –   | –   | –   | –   | –   |
| T6  | –  | –  | a  | b  | c  | d  | e  | f  | g  | –  | –   | –   | –   | –   | –   | –   |
| T7  | –  | –  | a  | b  | c  | d  | e  | f  | g  | h  | –   | –   | –   | –   | –   | –   |

|       | A0 | A1 | A2 | A3 | A4 | A5 | A6 | A7 |
|-------|----|----|----|----|----|----|----|----|
| (T7)  | –  | –  | a  | b  | c  | d  | e  | f  |

|     | A0 | A1 | A2 | A3 | A4 | A5 | A6 | A7 | A8 | A9 | A10 | A11 | A12 | A13 | A14 | A15 |
|-----|----|----|----|----|----|----|----|----|----|----|-----|-----|-----|-----|-----|-----|
| T8  | –  | –  | a  | b  | c  | d  | e  | f  | g  | h  | i   | –   | –   | –   | –   | –   |
| T9  | –  | –  | a  | b  | c  | d  | e  | f  | g  | h  | i   | j   | –   | –   | –   | –   |
| T10 | –  | –  | a  | b  | c  | d  | e  | f  | g  | h  | i   | j   | k   | –   | –   | –   |
| T11 | –  | –  | a  | b  | c  | d  | e  | f  | g  | h  | i   | j   | k   | l   | –   | –   |
| T12 | –  | –  | a  | b  | c  | d  | e  | f  | g  | h  | i   | j   | k   | l   | m   | –   |
| T13 | –  | –  | a  | b  | c  | d  | e  | f  | g  | h  | i   | j   | k   | l   | m   | n   |
| T14 | o  | –  | a  | b  | c  | d  | e  | f  | g  | h  | i   | j   | k   | l   | m   | n   |
| T15 | o  | p  | a  | b  | c  | d  | e  | f  | g  | h  | i   | j   | k   | l   | m   | n   |

|   | A8 | A9 | A10 | A11 | A12 | A13 | A14 | A15 |
|---|----|----|-----|-----|-----|-----|-----|-----|
|   | g  | h  | i   | j   | k   | l   | m   | n   |

|     | A0 | A1 | A2 | A3 | A4 | A5 | A6 | A7 | A8 | A9 | A10 | A11 | A12 | A13 | A14 | A15 |
|-----|----|----|----|----|----|----|----|----|----|----|-----|-----|-----|-----|-----|-----|
| T16 | o  | p  | q  | b  | c  | d  | e  | f  | g  | h  | i   | j   | k   | l   | m   | n   |
| T17 | o  | p  | q  | r  | c  | d  | e  | f  | g  | h  | i   | j   | k   | l   | m   | n   |
| T18 | o  | p  | q  | r  | s  | d  | e  | f  | g  | h  | i   | j   | k   | l   | m   | n   |
| T19 | o  | p  | q  | r  | s  | t  | e  | f  | g  | h  | i   | j   | k   | l   | m   | n   |
| T20 | o  | p  | q  | r  | s  | t  | u  | f  | g  | h  | i   | j   | k   | l   | m   | n   |
| T21 | o  | p  | q  | r  | s  | t  | u  | v  | g  | h  | i   | j   | k   | l   | m   | n   |
| T22 | o  | p  | q  | r  | s  | t  | u  | v  | w  | h  | i   | j   | k   | l   | m   | n   |
| T23 | o  | p  | q  | r  | s  | t  | u  | v  | w  | x  | i   | j   | k   | l   | m   | n   |

|        | A0 | A1 | A2 | A3 | A4 | A5 | A6 | A7 |
|--------|----|----|----|----|----|----|----|----|
| (T23)  | o  | p  | q  | r  | s  | t  | u  | v  |

|     | A0 | A1 | A2 | A3 | A4 | A5 | A6 | A7 | A8 | A9 | A10 | A11 | A12 | A13 | A14 | A15 |
|-----|----|----|----|----|----|----|----|----|----|----|-----|-----|-----|-----|-----|-----|
| T24 | o  | p  | q  | r  | s  | t  | u  | v  | w  | x  | y   | j   | k   | l   | m   | n   |
| T25 | o  | p  | q  | r  | s  | t  | u  | v  | w  | x  | y   | z   | k   | l   | m   | n   |
| T26 | o  | p  | q  | r  | s  | t  | u  | v  | w  | x  | y   | z   | A   | l   | m   | n   |
| T27 | o  | p  | q  | r  | s  | t  | u  | v  | w  | x  | y   | z   | A   | B   | m   | n   |
| T28 | o  | p  | q  | r  | s  | t  | u  | v  | w  | x  | y   | z   | A   | B   | C   | n   |
| T29 | o  | p  | q  | r  | s  | t  | u  | v  | w  | x  | y   | z   | A   | B   | C   | D   |
| T30 | E  | p  | q  | r  | s  | t  | u  | v  | w  | x  | y   | z   | A   | B   | C   | D   |
| T31 | E  | F  | q  | r  | s  | t  | u  | v  | w  | x  | y   | z   | A   | B   | C   | D   |

|        | A8 | A9 | A10 | A11 | A12 | A13 | A14 | A15 |
|--------|----|----|-----|-----|-----|-----|-----|-----|
| (T31)  | w  | x  | y   | z   | A   | B   | C   | D   |

FIG. 3

| ADDRESS | a0 | a1 | a2 | a3 | a4 | a5 | a6 | a7 | a8 | a9 | a10 | a11 | a12 | a13 | a14 | a15 | a16 | a17 | a18 | a19 | a20 | a21 | a22 | a23 | a24 | a25 | a26 | a27 | a28 | a29 | a30 | a31 |
|---|---|---|---|---|---|---|---|---|---|---|---|---|---|---|---|---|---|---|---|---|---|---|---|---|---|---|---|---|---|---|---|---|
| T8  | - | - | a | b | c | d | e | f |   |   |   |   |   |   |   |   |   |   |   |   |   |   |   |   |   |   |   |   |   |   |   |   |
| T16 | - | - | a | b | c | d | e | f | g | h | i | j | k | l | m | n |   |   |   |   |   |   |   |   |   |   |   |   |   |   |   |   |
| T24 | - | - | a | b | c | d | e | f | g | h | i | j | k | l | m | n | o | p | q | r | s | t | u | v |   |   |   |   |   |   |   |   |
| T32 | - | - | a | b | c | d | e | f | g | h | i | j | k | l | m | n | o | p | q | r | s | t | u | v | w | x | y | z | A | B | C | D |

FIG. 4

| | A0 | A1 | A2 | A3 | A4 | A5 | A6 | A7 |
|---|---|---|---|---|---|---|---|---|
| | − | − | a | b | c | d | e | f |

| | A0 | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|---|
| T0 | − | − | a | b | c | d | e | f | − | − | − | − | − | − | − | − |
| T1 | − | − | a | b | c | d | e | f | − | − | − | − | − | − | − | − |
| T2 | − | − | a | b | c | d | e | f | − | − | − | − | − | − | − | − |
| T3 | − | − | a | b | c | d | e | f | − | − | − | − | − | − | − | − |
| T4 | − | − | a | b | c | d | e | f | − | − | − | − | − | − | − | − |
| T5 | − | − | a | b | c | d | e | f | − | − | − | − | − | − | − | − |
| T6 | (−) | − | a | b | c | d | e | f | − | − | − | − | − | − | − | − |
| T7 | − | (−) | a | b | c | d | e | f | − | − | − | − | − | − | − | − |

| | A8 | A9 | A10 | A11 | A12 | A13 | A14 | A15 |
|---|---|---|---|---|---|---|---|---|
| | g | h | i | j | k | l | m | n |

| | A0 | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|---|
| T8 | − | − | (a) | b | c | d | e | f | g | h | i | j | k | l | m | n |
| T9 | − | − | a | (b) | c | d | e | f | g | h | i | j | k | l | m | n |
| T10 | − | − | a | b | (c) | d | e | f | g | h | i | j | k | l | m | n |
| T11 | − | − | a | b | c | (d) | e | f | g | h | i | j | k | l | m | n |
| T12 | − | − | a | b | c | d | (e) | f | g | h | i | j | k | l | m | n |
| T13 | − | − | a | b | c | d | e | (f) | g | h | i | j | k | l | m | n |
| T14 | − | − | a | b | c | d | e | f | (g) | h | i | j | k | l | m | n |
| T15 | − | − | a | b | c | d | e | f | g | (h) | i | j | k | l | m | n |

| | A0 | A1 | A2 | A3 | A4 | A5 | A6 | A7 |
|---|---|---|---|---|---|---|---|---|
| | o | p | q | r | s | t | u | v |

| | A0 | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|---|
| T16 | o | p | q | r | s | t | u | v | g | h | (i) | j | k | l | m | n |
| T17 | o | p | q | r | s | t | u | v | g | h | i | (j) | k | l | m | n |
| T18 | o | p | q | r | s | t | u | v | g | h | i | j | (k) | l | m | n |
| T19 | o | p | q | r | s | t | u | v | g | h | i | j | k | (l) | m | n |
| T20 | o | p | q | r | s | t | u | v | g | h | i | j | k | l | (m) | n |
| T21 | o | p | q | r | s | t | u | v | g | h | i | j | k | l | m | (n) |
| T22 | (o) | p | q | r | s | t | u | v | g | h | i | j | k | l | m | n |
| T23 | o | (p) | q | r | s | t | u | v | g | h | i | j | k | l | m | n |

| | A8 | A9 | A10 | A11 | A12 | A13 | A14 | A15 |
|---|---|---|---|---|---|---|---|---|
| | w | x | y | z | A | B | C | D |

| | A0 | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|---|
| T24 | o | p | (q) | r | s | t | u | v | w | x | y | z | A | B | C | D |
| T25 | o | p | q | (r) | s | t | u | v | w | x | y | z | A | B | C | D |
| T26 | o | p | q | r | (s) | t | u | v | w | x | y | z | A | B | C | D |
| T27 | o | p | q | r | s | (t) | u | v | w | x | y | z | A | B | C | D |
| T28 | o | p | q | r | s | t | (u) | v | w | x | y | z | A | B | C | D |
| T29 | o | p | q | r | s | t | u | (v) | w | x | y | z | A | B | C | D |
| T30 | o | p | q | r | s | t | u | v | (w) | x | y | z | A | B | C | D |
| T31 | o | p | q | r | s | t | u | v | w | (x) | y | z | A | B | C | D |

DIGITAL SIGNAL PROCESSING DEVICE AND CONTROL METHOD OF DIGITAL SIGNAL PROCESSING DEVICE

CROSS-REFERENCE TO RELATED APPLICATIONS

This application is based upon and claims the benefit of priority of the prior Japanese Patent Application No. 2020-160987, filed on Sep. 25, 2020, the entire contents of which are incorporated herein by reference.

BACKGROUND OF THE INVENTION

Field of the Invention

The present invention relates to a digital signal processing device and a control method of the digital signal processing device.

Description of the Related Art

Patent Document 1 describes an address circuit for virtual shifting within a digital signal processing device. In the address circuit, an index register is combined with an auxiliary index register, the same value as a low-order value of the index register is set in the auxiliary index register, an upper address is taken from the index register and a lower address is taken from the auxiliary index register to perform normal index modification, and a value, which is obtained by adding a low order of the index register and a pointer, is set in the auxiliary index register to perform address modification for virtual shifting.

Patent Document 2 describes an address generation circuit including a first counter and a second counter. A clearing means selectively clears the contents of the second counter to zero by a counting control signal to the first counter. An adder adds an output of the first counter and an output of the second counter.

Patent Document 3 describes a digital signal processing device for sound waveform data including a waveform signal processing unit and a memory access unit. The waveform signal processing unit performs waveform signal processing intended for adding effects to sound waveform data by means of M, (which is an integer of two or more), pieces of time-division waveform signal processing. The memory access unit enables a DRAM attached externally with K banks corresponding to K, (which is an integer of two or more and M or less), pieces of time-division waveform signal processing intended for delaying sound waveform data in the process of waveform signal processing to start access to the K banks at K timings different from each other, and when receiving a write or read request from one of K pieces of the time-division waveform signal processing, the memory access unit writes or reads sound waveform data by outputting a control signal, which is intended for writing to or reading from the corresponding bank, to the DRAM at a timing at which access to the bank can be started.

[Patent Document 1] Japanese Laid-open Patent Publication No. 58-2935

[Patent Document 2] Japanese Laid-open Patent Publication No. 62-57067

[Patent Document 3] Japanese Laid-open Patent Publication No. 2003-108122

In Patent Document 3, the sound waveform data are delayed in order to add effects to the sound waveform data. However, when using burst transfer of the DRAM, the delay time of the sound waveform data is limited to a multiple of a burst length. If all a plurality of delay signals are a multiple of the burst length, their periodicity causes a strong correlation to appear, failing to achieve high-quality effects.

In an audio delay device using a virtual shift pointer, when an access to a delay RAM is made in units of plural samples using the burst transfer of the DRAM, it is possible to achieve delays of multiple samples of the plural sample unit, but it is difficult to achieve a delay time of an arbitrary sampling period unit.

SUMMARY OF THE INVENTION

An object of the present invention is to enable the achievement of a delay having an arbitrary length without being confined to a delay time that is a multiple of a burst length with respect to a sampling period.

A digital signal processing device of the present invention includes: a DRAM that burst transfers burst length audio data; a first buffer memory capable of accumulating audio data that are twice the burst length; a control unit that starts writing audio data one word at a time from an arbitrary address of the first buffer memory in sequence at a sampling period and performs control to alternately burst transfer the burst length audio data in a first half area of the first buffer memory and the burst length audio data in a second half area of the first buffer memory to the DRAM; and a delay effect achievement unit using a virtual shift pointer, in which the control unit controls a delay length that is less than the burst length depending on how far in advance to write the audio data on the condition of performing control to burst transfer the burst length audio data in the first half area of the first buffer memory to the DRAM while writing audio data one word at a time to the second half area of the first buffer memory in sequence and performing control to burst transfer the burst length audio data in the second half area of the first buffer memory to the DRAM while writing audio data one word at a time to the first half area of the first buffer memory in sequence.

A control method of a digital signal processing device of the present invention is a control method of a digital signal processing device including: a DRAM that burst transfers burst length audio data; and a first buffer memory capable of accumulating audio data that are twice the burst length, the method including: starting writing audio data one word at a time from an arbitrary address of the first buffer memory in sequence at a sampling period; and performing control to alternately burst transfer the burst length audio data in a first half area of the first buffer memory and the burst length audio data in a second half area of the first buffer memory to the DRAM, in which a delay length that is less than the burst length is controlled depending on how far in advance to write the audio data on the condition of performing control to burst transfer the burst length audio data in the first half area of the first buffer memory to the DRAM while writing audio data one word at a time to the second half area of the first buffer memory in sequence and performing control to burst transfer the burst length audio data in the second half area of the first buffer memory to the DRAM while writing audio data one word at a time to the first half area of the first buffer memory in sequence.

BRIEF DESCRIPTION OF THE DRAWINGS

FIG. 2 is a view illustrating an access method of a first buffer memory;

FIG. 3 is a view illustrating an access method of a SDRAM; and

FIG. 4 is a view illustrating an access method of a second buffer memory.

Figure 1:
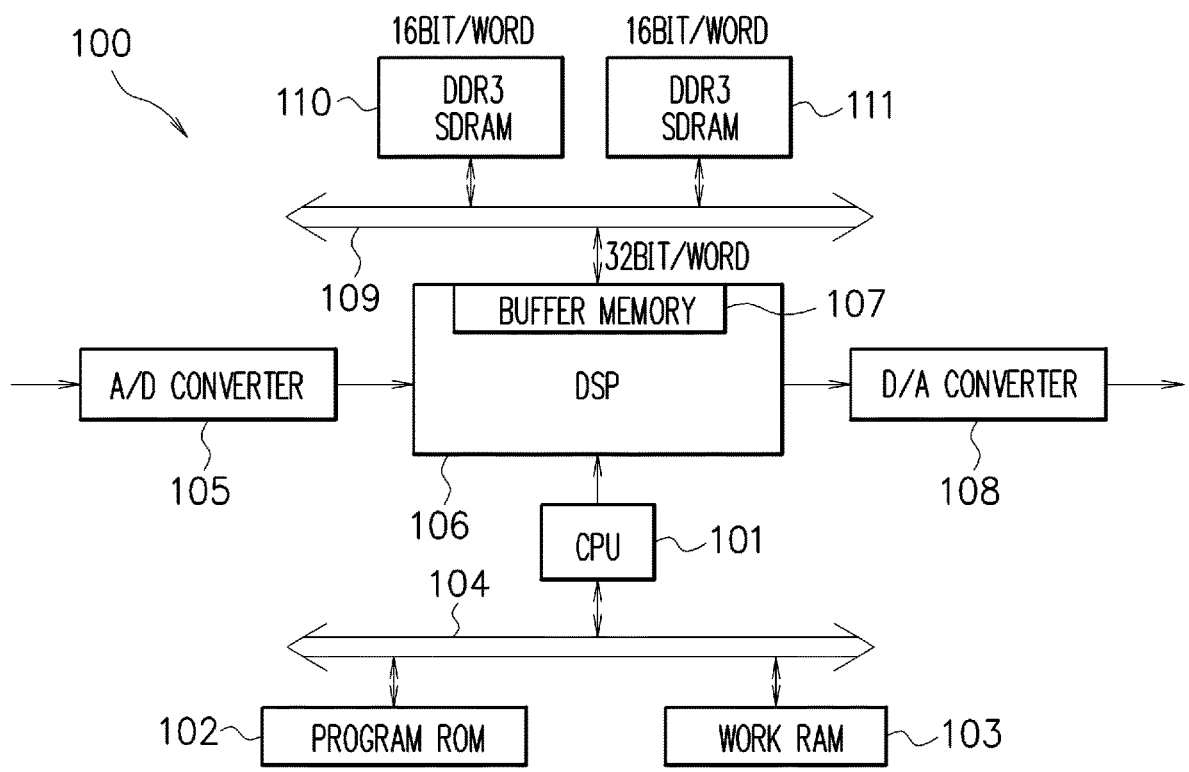
FIG. 1 is a diagram illustrating a configuration example of a digital signal processing device according to this embodiment.

DETAILED DESCRIPTION OF THE
PREFERRED EMBODIMENTS

FIG. 1 is a diagram illustrating a configuration example of a digital signal processing device 100 according to this embodiment. The digital signal processing device 100 is an effect device that makes reverb, for example. When an original sound is generated, a direct sound and a delayed sound of the original sound are synthesized to reach a human ear. The direct sound is sound of the original sound reaching a human ear directly. The delayed sound is a plurality of delayed sounds with different delay times that are generated by the original sound being reflected from various objects. The digital signal processing device 100 generates a plurality of delay signals with different delay times for audio data of the original sound and synthesizes the audio data of the original sound and a plurality of the delay signals, to thereby make reverb.

The digital signal processing device 100 includes a CPU 101, a program ROM 102, a work RAM 103, a bus 104, an analog/digital converter 105, a DSP 106, a digital/analog converter 108, a bus 109, a SDRAM 110, and a SDRAM 111. The DSP 106 includes first and second buffer memories 107. There will be explained a control method of the digital signal processing device 100 below.

Each of the first and second buffer memories 107 is capable of receiving and outputting 32-bit (one-word) wide audio data from and to the bus 109. The first and second buffer memories 107 are, for example, a SRAM (static random access memory) and can accumulate audio data.

The SDRAMs 110 and 111 are a synchronous dynamic random access memory and are a type of DRAM (dynamic random access memory). The SDRAMs 110 and 111 are, for example, a DDR3 SDRAM.

The SDRAM 110 is capable of receiving and outputting 16-bit (one-word) audio data from and to the bus 109. The SDRAM 110 is capable of receiving and outputting 16-bit (one-word) audio data from and to the bus 109.

Each of the first and second buffer memories 107 can receive and output 32-bit (one-word) audio data from and to the SDRAMs 110 and 111 via the bus 109. The 16-bit audio data that are input to and output from the SDRAM 110 are the upper 16-bit audio data of the 32-bit audio data that are input to and output from the first or second buffer memory 107. The 16-bit audio data that are input to and output from the SDRAM 111 are the lower 16-bit audio data of the 32-bit audio data that are input to and output from the first or second buffer memory 107.

The SDRAMs 110 and 111 are capable of burst transferring audio data with a word count that is a burst length of two or more (a first number) to each of the first and second buffer memories 107 via the bus 109. That is, the SDRAMs 110 and 111 continuously and rapidly transfer audio data with a word count that is a burst length, to each of the first and second buffer memories 107 based on one piece of address information via the bus 109. The burst length is, for example, four words or eight words. The case where the burst length is eight words will be explained below as an example.

The CPU 101 is a central processing unit. The program ROM (read-only memory) 102 stores a program. The work RAM (random access memory) 103 functions as a work region for the CPU 101. The CPU 101 expands the program stored in the program ROM 102 to the work RAM 103 and executes the program expanded in the work RAM 103, to thereby control the DSP 106. The DSP 106 is a digital signal processor and is a type of control unit.

The analog/digital converter 105 receives an analog audio signal of the original sound from a microphone or the like, and converts the analog audio signal into digital one-word (32-bit) audio data at a sampling period. The audio data are musical sound data or voice data.

The DSP 106 writes the digital audio data converted by the analog/digital converter 105 one word at a time to the first buffer memory 107 in sequence at a sampling period. Note that the DSP 106 may receive digital audio data from a musical sound generation device, audio receiving device, or the like instead of the analog/digital converter 105.

Then, the DSP 106 performs control to burst transfer the audio data with a word count (eight words) that is the burst length to the SDRAMs 110 and 111 from the first buffer memory 107. The DSP 106 writes the audio data with a word count (eight words) that is the burst length to addresses indicated by write pointers of the SDRAMs 110 and 111.

Then, the DSP 106 performs control to burst transfer the audio data with a word count (eight words) that is the burst length to the second buffer memory 107 from the SDRAMs 110 and 111. On this occasion, the DSP 106 reads the audio data with a word count (eight words) that is the burst length from addresses indicated by read pointers of the SDRAMs 110 and 111 and performs control to burst transfer them. The DSP 106 writes the audio data with a word count (eight words) that is the burst length to the second buffer memory 107 by the burst transfer.

The difference between the addresses indicated by the write pointers and the addresses indicated by the read pointers of the SDRAMs 110 and 111 corresponds to a delay time of the delay signal responsive to the original sound. This delay time is a delay time that is a multiple of the burst length (a multiple of 8) with respect to the sampling period.

Instead of the SDRAMs 110 and 111, a SRAM can be used to generate delay signals, but a SRAM with a large capacity is required in order to generate delay signals with long delay times. The SRAM has the disadvantage of being more expensive than the SDRAMs 110 and 111. Thus, in this embodiment, using the SDRAMs 110 and 111 enables the generation of delay signals, thereby making it possible to reduce the cost. Further, using the burst transfer of the SDRAMs 110 and 111 makes it possible to rapidly generate a large number of delay signals in real time.

Then, the DSP 106 reads the audio data transferred to the second buffer memory 107 in units of one word at a sampling period, to thereby generate a plurality of delay signals responsive to the original sound. The reading timing of the second buffer memory 107 corresponds to the delay time of the delay signal responsive to the original sound.

Then, the DSP 106 synthesizes the audio data of the original sound converted by the analog/digital converter 105 and the above-described delay signals, and outputs synthesized audio data to the digital/analog converter 108. Incidentally, the DSP 106 does not necessarily have to synthesize them, but a device external to the DSP 106 may synthesize them.

The digital/analog converter 108 converts the digital one-word (32-bit) audio data into an analog audio signal at a sampling period, and outputs the analog audio signal to an audio system. The audio system includes an amplifier and a speaker, in which the amplifier amplifies the audio signal and the speaker pronounces the amplified audio signal. As a result, a sound with the effect of reverb added to the original sound is pronounced.

FIG. 2 is a view illustrating an access method of the first buffer memory 107. The buffer memory 107 is a ring buffer that has addresses A0 to A15 and is capable of accumulating audio data that are twice the burst length (16 words). Sampling periods T0 to T31 each are a sampling period of the analog/digital converter 105.

At the periods T0 to T31, the DSP 106 writes audio data a to Z and A to F converted by the analog/digital converter 105 to the first buffer memory 107.

At the sampling period T0, the DSP 106 writes the audio data a converted by the analog/digital converter 105 to the address A2 of the first buffer memory 107.

At the sampling period T1, the DSP 106 writes the audio data b converted by the analog/digital converter 105 to the address A3 of the first buffer memory 107.

At the sampling period T2, the DSP 106 writes the audio data c converted by the analog/digital converter 105 to the address A4 of the first buffer memory 107.

At the sampling period T3, the DSP 106 writes the audio data d converted by the analog/digital converter 105 to the address A5 of the first buffer memory 107.

At the sampling period T4, the DSP 106 writes the audio data e converted by the analog/digital converter 105 to the address A6 of the first buffer memory 107.

At the sampling period T5, the DSP 106 writes the audio data f converted by the analog/digital converter 105 to the address A7 of the first buffer memory 107.

At the sampling period T6, the DSP 106 writes the audio data g converted by the analog/digital converter 105 to the address A8 of the first buffer memory 107.

At the sampling period T7, the DSP 106 writes the audio data h converted by the analog/digital converter 105 to the address A9 of the first buffer memory 107.

Further, at the sampling period T7, the DSP 106 burst transfers the audio data with a word count (eight words) that is the burst length "-, -, a, b, c, d, e, f" accumulated at the addresses A0 to A7 of the first buffer memory 107 to the SDRAMs 110 and 111 to write them thereto. Here, "-" is an indefinite value. As illustrated in FIG. 3, at the sampling period T8, the audio data "-, -, a, b, c, d, e, f" are written to addresses a0 to a7 of the SDRAMs 110 and 111.

At the sampling period T8, the DSP 106 writes the audio data i converted by the analog/digital converter 105 to the address A10 of the first buffer memory 107.

At the sampling period T9, the DSP 106 writes the audio data j converted by the analog/digital converter 105 to the address A11 of the first buffer memory 107.

At the sampling period T10, the DSP 106 writes the audio data k converted by the analog/digital converter 105 to the address A12 of the first buffer memory 107.

At the sampling period T11, the DSP 106 writes the audio data 1 converted by the analog/digital converter 105 to the address A13 of the first buffer memory 107.

At the sampling period T12, the DSP 106 writes the audio data m converted by the analog/digital converter 105 to the address A14 of the first buffer memory 107.

At the sampling period T13, the DSP 106 writes the audio data n converted by the analog/digital converter 105 to the address A15 of the first buffer memory 107.

At the sampling period T14, the DSP 106 writes the audio data o converted by the analog/digital converter 105 to the address A0 of the first buffer memory 107.

At the sampling period T15, the DSP 106 writes the audio data p converted by the analog/digital converter 105 to the address A1 of the first buffer memory 107.

Further, at the sampling period T15, the DSP 106 burst transfers the audio data with a word count (eight words) that is the burst length "g, h, i, j, k, l, m, n" accumulated at the addresses A8 to A15 of the first buffer memory 107 to the SDRAMs 110 and 111 to write them thereto. As illustrated in FIG. 3, at the sampling period T16, the audio data "g, h, i, j, k, l, m, n" are written to addresses a8 to a15 of the SDRAMs 110 and 111.

At the sampling period T16, the DSP 106 overwrites the audio data q converted by the analog/digital converter 105 to the address A2 of the first buffer memory 107.

At the sampling period T17, the DSP 106 overwrites the audio data r converted by the analog/digital converter 105 to the address A3 of the first buffer memory 107.

At the sampling period T18, the DSP 106 overwrites the audio data s converted by the analog/digital converter 105 to the address A4 of the first buffer memory 107.

At the sampling period T19, the DSP 106 overwrites the audio data t converted by the analog/digital converter 105 to the address A5 of the first buffer memory 107.

At the sampling period T20, the DSP 106 overwrites the audio data u converted by the analog/digital converter 105 to the address A6 of the first buffer memory 107.

At the sampling period T21, the DSP 106 overwrites the audio data v converted by the analog/digital converter 105 to the address A7 of the first buffer memory 107.

At the sampling period T22, the DSP 106 overwrites the audio data w converted by the analog/digital converter 105 to the address A8 of the first buffer memory 107.

At the sampling period T23, the DSP 106 overwrites the audio data x converted by the analog/digital converter 105 to the address A9 of the first buffer memory 107.

Further, at the sampling period T23, the DSP 106 burst transfers the audio data with a word count (eight words) that is the burst length "o, p, q, r, s, t, u, v" accumulated at the addresses A0 to A7 of the first buffer memory 107 to the SDRAMs 110 and 111 to write them thereto. As illustrated in FIG. 3, at the sampling period T24, the audio data "o, p, q, r, s, t, u, v" are written to addresses a16 to a23 of the SDRAMs 110 and 111.

At the sampling period T24, the DSP 106 overwrites the audio data y converted by the analog/digital converter 105 to the address A10 of the first buffer memory 107.

At the sampling period T25, the DSP 106 overwrites the audio data z converted by the analog/digital converter 105 to the address A11 of the first buffer memory 107.

At the sampling period T26, the DSP 106 overwrites the audio data A converted by the analog/digital converter 105 to the address A12 of the first buffer memory 107.

At the sampling period T27, the DSP 106 overwrites the audio data B converted by the analog/digital converter 105 to the address A13 of the first buffer memory 107.

At the sampling period T28, the DSP 106 overwrites the audio data C converted by the analog/digital converter 105 to the address A14 of the first buffer memory 107.

At the sampling period T29, the DSP 106 overwrites the audio data D converted by the analog/digital converter 105 to the address A15 of the first buffer memory 107.

At the sampling period T30, the DSP 106 overwrites the audio data E converted by the analog/digital converter 105 to the address A0 of the first buffer memory 107.

At the sampling period T31, the DSP 106 overwrites the audio data F converted by the analog/digital converter 105 to the address A1 of the first buffer memory 107.

Further, at the sampling period T31, the DSP 106 burst transfers the audio data with a word count (eight words) that is the burst length "w, x, y, z, A, B, C, D" accumulated at the addresses A8 to A15 of the first buffer memory 107 to the SDRAMs 110 and 111 to write them thereto. As illustrated in FIG. 3, at the sampling period T32, the audio data "w, x, y, z, A, B, C, D" are written to addresses a24 to a31 of the SDRAMs 110 and 111. The DSP 106 performs the same processing as above repeatedly thereafter.

As above, the DSP 106 starts writing the audio data a to z and A to F converted by the analog/digital converter 105 one word at a time from the address A2 of the first buffer memory 107 in sequence at the sampling periods T0 to T31. Then, the DSP 106 performs control to burst transfer the audio data "-, -, a to z, A to F" starting from the first address A0 of the first buffer memory 107 to the SDRAMs 110 and 111 in units of the word count (eight words) that is the burst length. On this occasion, the DSP 106 performs control to alternately burst transfer burst length audio data in a first half area of the first buffer memory 107 and burst length audio data in a second half area of the first buffer memory 107 to the SDRAMs 110 and 111. This allows the DSP 106 to write the audio data a to z and A to F to the addresses starting from the address a2 of the SDRAMs 110 and 111 in sequence.

The DSP 106 controls a delay length that is less than the burst length depending on how far in advance to write the audio data on the condition of performing control to burst transfer the burst length audio data in the first half area of the first buffer memory 107 to the SDRAMs 110 and 111 while writing the audio data one word at a time to the second half area of the first buffer memory 107 in sequence and performing control to burst transfer the burst length audio data in the second half area of the first buffer memory 107 to the SDRAMs 110 and 111 while writing the audio data one word at a time to the first half area of the first buffer memory 107 in sequence.

Incidentally, the DSP 106 may start writing the audio data a to z and A to F converted by the analog/digital converter 105 one word at a time from the arbitrary addresses A0 to A15 of the first buffer memory 107 in sequence at the sampling periods T0 to T31. This allows the DSP 106 to write the audio data a to z and A to F to the addresses starting from the arbitrary addresses a0 to a15 of the SDRAMs 110 and 111 in sequence.

Accordingly, the DSP 106 can start writing the audio data a to z and A to F converted by the analog/digital converter 105 in units of one word from the addresses A1 to A15 other than the first address A0 of the first buffer memory 107 in sequence at the sampling periods T0 to T31.

Further, the DSP 106 preferably starts writing the audio data a to z and A to F converted by the analog/digital converter 105 one word at a time from an arbitrary address of the addresses ranging from the first address A0 of the first buffer memory 107 to the address A7 that is one before the address A8 obtained by adding the number of the burst length (eight words) to the first address A0 in sequence at the sampling periods T0 to T31.

FIG. 4 is a view illustrating an access method of the second buffer memory 107. The second buffer memory 107 is a ring buffer that has addresses A0 to A15 and is capable of accumulating audio data that are twice the burst length (16 words). Sampling periods T0 to T31 each are the sampling period of the analog/digital converter 105.

At the sampling period T0, the DSP 106 burst transfers the audio data with a word count (eight words) that is the burst length "-, -, a, b, c, d, e, f" stored at the addresses a0 to a7 of the SDRAMs 110 and 111 in FIG. 3 to the addresses A0 to A7 of the second buffer memory 107.

In FIG. 2, the DSP 106 writes the audio data accumulated in the first buffer memory 107 to the addresses indicated by the write pointers of the SDRAMs 110 and 111. At the sampling period T0 in FIG. 4, the DSP 106 reads the audio data from the addresses indicated by the read pointers of the SDRAMs 110 and 111. The difference between the addresses indicated by the write pointers of the SDRAMs 110 and 111 and the addresses indicated by the read pointers corresponds to the delay time of the delay signal responsive to the original sound. This delay time is a multiple of 8 of the sampling period (a multiple of the number of the burst length).

At the sampling periods T0 to T5, the DSP 106 does not read the audio data accumulated in the second buffer memory 107, but waits.

At the sampling period T6, the DSP 106 reads the audio data "-" accumulated at the address A0 of the second buffer memory 107.

At the sampling period T7, the DSP 106 reads the audio data "-" accumulated at the address A1 of the second buffer memory 107.

At the sampling period T8, the DSP 106 burst transfers the audio data with a word count (eight words) that is the burst length "g, h, i, j, k, 1, m, n" stored at the addresses a8 to a15 of the SDRAMs 110 and 111 in FIG. 3 to the addresses A8 to A15 of the second buffer memory 107.

Further, at the sampling period T8, the DSP 106 reads the audio data a accumulated at the address A2 of the second buffer memory 107, to thereby generate a delay signal. Then, the DSP 106 synthesizes the audio data of the original sound converted by the analog/digital converter 105 and the delay signal.

At the sampling period T9, the DSP 106 reads the audio data b accumulated at the address A3 of the second buffer memory 107, to thereby generate a delay signal. Then, the DSP 106 synthesizes the audio data of the original sound converted by the analog/digital converter 105 and the delay signal.

At the sampling period T10, the DSP 106 reads the audio data c accumulated at the address A4 of the second buffer memory 107, to thereby generate a delay signal. Then, the DSP 106 synthesizes the audio data of the original sound converted by the analog/digital converter 105 and the delay signal.

At the sampling period T11, the DSP 106 reads the audio data d accumulated at the address A5 of the second buffer memory 107, to thereby generate a delay signal. Then, the DSP 106 synthesizes the audio data of the original sound converted by the analog/digital converter 105 and the delay signal.

At the sampling period T12, the DSP 106 reads the audio data e accumulated at the address A6 of the second buffer memory 107, to thereby generate a delay signal. Then, the DSP 106 synthesizes the audio data of the original sound converted by the analog/digital converter 105 and the delay signal.

At the sampling period T13, the DSP 106 reads the audio data f accumulated at the address A7 of the second buffer memory 107, to thereby generate a delay signal. Then, the DSP 106 synthesizes the audio data of the original sound converted by the analog/digital converter 105 and the delay signal.

At the sampling period T14, the DSP 106 reads the audio data g accumulated at the address A8 of the second buffer memory 107, to thereby generate a delay signal. Then, the DSP 106 synthesizes the audio data of the original sound converted by the analog/digital converter 105 and the delay signal.

At the sampling period T15, the DSP 106 reads the audio data h accumulated at the address A9 of the second buffer memory 107, to thereby generate a delay signal. Then, the DSP 106 synthesizes the audio data of the original sound converted by the analog/digital converter 105 and the delay signal.

At the sampling period T16, the DSP 106 burst transfers the audio data with a word count (eight words) that is the burst length "o, p, q, r, s, t, u, v" stored at the addresses a16 to a23 of the SDRAMs 110 and 111 in FIG. 3 to the addresses A0 to A7 of the second buffer memory 107.

Further, at the sampling period T16, the DSP 106 reads the audio data i accumulated at the address A10 of the second buffer memory 107, to thereby generate a delay signal. Then, the DSP 106 synthesizes the audio data of the original sound converted by the analog/digital converter 105 and the delay signal.

At the sampling period T17, the DSP 106 reads the audio data j accumulated at the address A11 of the second buffer memory 107, to thereby generate a delay signal. Then, the DSP 106 synthesizes the audio data of the original sound converted by the analog/digital converter 105 and the delay signal.

At the sampling period T18, the DSP 106 reads the audio data k accumulated at the address A12 of the second buffer memory 107, to thereby generate a delay signal. Then, the DSP 106 synthesizes the audio data of the original sound converted by the analog/digital converter 105 and the delay signal.

At the sampling period T19, the DSP 106 reads the audio data 1 accumulated at the address A13 of the second buffer memory 107, to thereby generate a delay signal. Then, the DSP 106 synthesizes the audio data of the original sound converted by the analog/digital converter 105 and the delay signal.

At the sampling period T20, the DSP 106 reads the audio data m accumulated at the address A14 of the second buffer memory 107, to thereby generate a delay signal. Then, the DSP 106 synthesizes the audio data of the original sound converted by the analog/digital converter 105 and the delay signal.

At the sampling period T21, the DSP 106 reads the audio data n accumulated at the address A15 of the second buffer memory 107, to thereby generate a delay signal. Then, the DSP 106 synthesizes the audio data of the original sound converted by the analog/digital converter 105 and the delay signal.

At the sampling period T22, the DSP 106 reads the audio data o accumulated at the address A0 of the second buffer memory 107, to thereby generate a delay signal. Then, the DSP 106 synthesizes the audio data of the original sound converted by the analog/digital converter 105 and the delay signal.

At the sampling period T23, the DSP 106 reads the audio data p accumulated at the address A1 of the second buffer memory 107, to thereby generate a delay signal. Then, the DSP 106 synthesizes the audio data of the original sound converted by the analog/digital converter 105 and the delay signal.

At the sampling period T24, the DSP 106 burst transfers the audio data with a word count (eight words) that is the burst length "w, x, y, z, A, B, C, D" stored at the addresses a24 to a31 of the SDRAMs 110 and 111 in FIG. 3 to the addresses A8 to A15 of the second buffer memory 107.

Further, at the sampling period T24, the DSP 106 reads the audio data q accumulated at the address A2 of the second buffer memory 107, to thereby generate a delay signal. Then, the DSP 106 synthesizes the audio data of the original sound converted by the analog/digital converter 105 and the delay signal.

At the sampling period T25, the DSP 106 reads the audio data r accumulated at the address A3 of the second buffer memory 107, to thereby generate a delay signal. Then, the DSP 106 synthesizes the audio data of the original sound converted by the analog/digital converter 105 and the delay signal.

At the sampling period T26, the DSP 106 reads the audio data s accumulated at the address A4 of the second buffer memory 107, to thereby generate a delay signal. Then, the DSP 106 synthesizes the audio data of the original sound converted by the analog/digital converter 105 and the delay signal.

At the sampling period T27, the DSP 106 reads the audio data t accumulated at the address A5 of the second buffer memory 107, to thereby generate a delay signal. Then, the DSP 106 synthesizes the audio data of the original sound converted by the analog/digital converter 105 and the delay signal.

At the sampling period T28, the DSP 106 reads the audio data u accumulated at the address A6 of the second buffer memory 107, to thereby generate a delay signal. Then, the DSP 106 synthesizes the audio data of the original sound converted by the analog/digital converter 105 and the delay signal.

At the sampling period T29, the DSP 106 reads the audio data v accumulated at the address A7 of the second buffer memory 107, to thereby generate a delay signal. Then, the DSP 106 synthesizes the audio data of the original sound converted by the analog/digital converter 105 and the delay signal.

At the sampling period T30, the DSP 106 reads the audio data w accumulated at the address A8 of the second buffer memory 107, to thereby generate a delay signal. Then, the DSP 106 synthesizes the audio data of the original sound converted by the analog/digital converter 105 and the delay signal.

At the sampling period T31, the DSP 106 reads the audio data x accumulated at the address A9 of the second buffer memory 107, to thereby generate a delay signal. Then, the DSP 106 synthesizes the audio data of the original sound converted by the analog/digital converter 105 and the delay signal. The DSP 106 performs the same processing as above repeatedly thereafter.

Incidentally, the burst transfer for writing in FIG. 2 and the burst transfer for reading in FIG. 4 have been explained with an example in which one burst transfer is performed every eight sampling periods, but they are not limited to this. In FIG. 2, the DSP 106 may perform two burst transfers every eight sampling periods. For example, at the sampling period T7 in FIG. 2, the DSP 106 burst transfers the audio data at the addresses A0 to A7 of the first buffer memory 107 to the SDRAMs 110 and 111, and burst transfers the audio data at the addresses A8 to A15 of the first buffer memory 107 to the SDRAMs 110 and 111. Further, at the sampling period T15 in FIG. 2, the DSP 106 burst transfers the audio data at the addresses A8 to A15 of the first buffer memory 107 to the SDRAMs 110 and 111, and burst transfers the audio data at the addresses A0 to A7 of the first buffer memory 107 to the SDRAMs 110 and 111. With these two burst transfers, the audio data are written to the SDRAMs 110 and 111 in more real time. This means that a delay of a smaller sample number can be achieved.

As above, the DSP 106 performs control to burst transfer the audio data with a word count (eight words) that is the burst length to the second buffer memory 107 from the SDRAMs 110 and 111. On this occasion, the DSP 106 performs control to alternately perform the burst transfer of the burst length audio data to a first half area of the second buffer memory 107 from the SDRAMs 110 and 111 and the burst transfer of the burst length audio data to a second half area of the second buffer memory 107 from the SDRAMs 110 and 111. Further, from the sampling period T6, which is following six sampling periods relative to the sampling period T0 of the burst transfer, the DSP 106 starts reading the audio data transferred to the second buffer memory 107 in units of one word in sequence at the sampling periods T6 to T31.

The DSP 106 controls a delay length that is less than the burst length depending on how far in advance to read the audio data on the condition of performing control to burst transfer the burst length audio data to the first half area of the second buffer memory 107 from the SDRAMs 110 and 111 while reading the audio data one word at a time from the second half area of the second buffer memory 107 in sequence and performing control to burst transfer the burst length audio data to the second half area of the second buffer memory 107 from the SDRAMs 110 and 111 while reading the audio data one word at a time from the first half area of the second buffer memory 107 in sequence. The difference between the timing of the burst transfer of the SDRAMs 110 and 111 and the timing of the reading/writing from/to the buffer memory 107 is controlled, thereby making it possible to generate audio data having a delay time of a sampling period unit shorter than that of a burst transfer period unit.

At the sampling period T8, the DSP 106 reads the audio data a to z and A to F in units of one word in sequence, with the address A2 of the second buffer memory 107 set as a starting address. Therefore, from the sampling period T6, the DSP 106 starts reading the audio data with the address A0 of the second buffer memory 107 set as a starting address.

Incidentally, from the sampling periods T0 to T31 following an arbitrary number of sampling periods relative to the sampling period T0 of the burst transfer, the DSP 106 may start reading the audio data transferred to the second buffer memory 107 in units of one word in sequence at the sampling periods T0 to T31.

For example, from the sampling period T0, the DSP 106 starts reading the audio data with the address A0 of the second buffer memory 107 set as a starting address, thereby being able to read the audio data a to z and A to F in units of one word in sequence with the address A2 of the second buffer memory 107 set as a starting address at the sampling period T2.

Further, from the sampling period T1, the DSP 106 starts reading the audio data with the address A0 of the second buffer memory 107 set as a starting address, thereby being able to read the audio data a to z and A to F in units of one word in sequence with the address A2 of the second buffer memory 107 set as a starting address at the sampling period T3.

Further, from the sampling period T2, the DSP 106 starts reading the audio data with the address A0 of the second buffer memory 107 set as a starting address, thereby being able to read the audio data a to z and A to F in units of one word in sequence with the address A2 of the second buffer memory 107 set as a starting address at the sampling period T4.

Accordingly, from the sampling periods T1 to T31 following one sampling period or more relative to the sampling period T0 of the burst transfer, the DSP 106 can start reading the audio data transferred to the second buffer memory 107 in units of one word in sequence at the sampling periods T1 to T31.

Further, from the sampling periods T2 to T31 following two sampling periods or more relative to the sampling period T0 of the burst transfer, the DSP 106 can start reading the audio data transferred to the second buffer memory 107 in units of one word in sequence at the sampling periods T2 to T31.

Further, from the arbitrary sampling periods T0 to T7 ranging from the sampling period T0 of the burst transfer to the sampling period T7, which is one before the sampling period T8 following sampling periods of the number of the burst length (eight words) relative to the sampling period T0 of the burst transfer, the DSP 106 preferably starts reading the audio data transferred to the second buffer memory 107 in units of one word in sequence at the sampling periods T0 to T31.

According to this embodiment, the DSP 106 can generate not only a delay signal having a delay time that is a multiple of 8 of the sampling period (a multiple of the burst length), but also a delay signal having a delay time of the sampling period unit.

When reading the audio data a from the address A2 of the second buffer memory 107 at the sampling period T8 as illustrated in FIG. 4, the DSP 106 can generate a delay signal having a delay time that is a multiple of 8 of the sampling period.

Further, when reading the audio data a from the address A2 of the second buffer memory 107 at the sampling period T9, the DSP 106 can generate a delay signal having a delay time of (a multiple of 8 of the sampling period)+(a sampling period)×1.

Further, when reading the audio data a from the address A2 of the second buffer memory 107 at the sampling period T7, the DSP 106 can generate a delay signal having a delay time of (a multiple of 8 of the sampling period)−(a sampling period)×1.

Further, when reading the audio data a from the address A2 of the second buffer memory 107 at the sampling period T6, the DSP 106 can generate a delay signal having a delay time of (a multiple of 8 of the sampling period)−(a sampling period)×2.

Similarly, when reading the audio data a from the address A2 of the second buffer memory 107 at the sampling period T2, the DSP 106 can generate a delay signal having a delay time of (a multiple of 8 of the sampling period)−(a sampling period)×6.

As above, the DSP 106 can generate not only a delay signal having a delay time that is a multiple of 8 of the sampling period (a multiple of the burst length), but also a delay signal having a delay time of the sampling period unit. The DSP 106 is a delay effect achievement unit using a virtual shift pointer.

When assuming that the burst length is N samples, there are N different timings for writing N pieces of audio data to the first buffer memory 107 one word at a time. In the first buffer memory 107, the delay amount differs by one sample between the case of writing N pieces of audio data immediately after the area where the burst transfer has been performed and the case of starting writing one address ahead. Similarly, when starting writing M addresses ahead, the delay amount differs by M samples. In this way, a delay amount of N samples×an integer+M can be achieved. On the contrary, when reading from the SDRAMs 110 and 111 to the second buffer memory 107, the processing is performed in the same manner, and thereby the delay control in units of one sample is enabled.

Incidentally, the DSP 106 generates a plurality of delay signals with different delay times through time-division processing, and synthesizes audio data of an original sound and a plurality of the delay signals, thereby making it possible to make high quality reverb.

When all a plurality of the delay signals are a multiple of the burst length of the sampling period, their periodicity causes a strong correlation to appear, failing to make high-quality reverb. According to this embodiment, the DSP 106 can generate not only a delay signal having a delay time that is a multiple of the burst length of the sampling period, but also a delay signal having a delay time of the sampling period unit, and thus it is possible to make high-quality reverb.

According to the present invention, it is possible to achieve a delay having an arbitrary length without being confined to the delay time that is a multiple of the burst length with respect to the sampling period.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

What is claimed is:

1. A digital signal processing device, comprising:
a DRAM that burst transfers burst length audio data;
a first buffer memory capable of accumulating audio data that are twice the burst length;
a control unit that starts writing audio data one word at a time from an arbitrary address of the first buffer memory in sequence at a sampling period and performs control to alternately burst transfer the burst length audio data in a first half area of the first buffer memory and the burst length audio data in a second half area of the first buffer memory to the DRAM; and
a delay effect achievement unit using a virtual shift pointer, wherein
the control unit controls a delay length that is less than the burst length depending on how far in advance to write the audio data on the condition of performing control to burst transfer the burst length audio data in the first half area of the first buffer memory to the DRAM while writing audio data one word at a time to the second half area of the first buffer memory in sequence and performing control to burst transfer the burst length audio data in the second half area of the first buffer memory to the DRAM while writing audio data one word at a time to the first half area of the first buffer memory in sequence.

2. The digital signal processing device according to claim 1, further comprising:
a second buffer memory capable of accumulating audio data that are twice the burst length, wherein
the control unit performs control to alternately perform burst transfer of the burst length audio data to a first half area of the second buffer memory from the DRAM and burst transfer of the burst length audio data to a second half area of the second buffer memory from the DRAM, and from a sampling period following an arbitrary number of sampling periods relative to a sampling period of the burst transfer, starts reading audio data transferred to the second buffer memory one word at a time in sequence at the sampling period, and
the control unit controls a delay length that is less than the burst length depending on how far in advance to read the audio data on the condition of performing control to burst transfer the burst length audio data to the first half area of the second buffer memory from the DRAM while reading the audio data one word at a time from the second half area of the second buffer memory in sequence and performing control to burst transfer the burst length audio data to the second half area of the second buffer memory from the DRAM while reading the audio data one word at a time from the first half area of the second buffer memory in sequence.

3. The digital signal processing device according to claim 1, wherein
the DRAM is a SDRAM.

4. The digital signal processing device according to claim 2, wherein
the DRAM is a SDRAM.

5. A control method of a digital signal processing device including: a DRAM that burst transfers burst length audio data; and
a first buffer memory capable of accumulating audio data that are twice the burst length, the method comprising:
starting writing audio data one word at a time from an arbitrary address of the first buffer memory in sequence at a sampling period; and
performing control to alternately burst transfer the burst length audio data in a first half area of the first buffer memory and the burst length audio data in a second half area of the first buffer memory to the DRAM, wherein
a delay length that is less than the burst length is controlled depending on how far in advance to write the audio data on the condition of performing control to burst transfer the burst length audio data in the first half area of the first buffer memory to the DRAM while writing audio data one word at a time to the second half area of the first buffer memory in sequence and performing control to burst transfer the burst length audio data in the second half area of the first buffer memory to the DRAM while writing audio data one word at a time to the first half area of the first buffer memory in sequence.

* * * * *